US012787526B2

(12) United States Patent
Arndt

(10) Patent No.: US 12,787,526 B2
(45) Date of Patent: Nov. 3, 2026

(54) SURFACE-MOUNTABLE OPTOELECTRONIC SEMICONDUCTOR COMPONENT AND LEADFRAME ASSEMBLY

(71) Applicant: ams-OSRAM International GmbH, Regensburg (DE)

(72) Inventor: Karlheinz Arndt, Bad Abbach (DE)

(73) Assignee: ams-OSRAM International GmbH, Regensburg (DE)

( * ) Notice: Subject to any disclaimer, the term of this patent is extended or adjusted under 35 U.S.C. 154(b) by 354 days.

(21) Appl. No.: 18/579,468

(22) PCT Filed: Jul. 25, 2022

(86) PCT No.: PCT/EP2022/070794

§ 371 (c)(1),
(2) Date: Jan. 15, 2024

(87) PCT Pub. No.: WO2023/006667

PCT Pub. Date: Feb. 2, 2023

(65) Prior Publication Data

US 2024/0347683 A1 Oct. 17, 2024

(30) Foreign Application Priority Data

Jul. 27, 2021 (DE) ......................... 102021119451.2
Aug. 17, 2021 (DE) ......................... 102021121365.7

(51) Int. Cl.
*H10H 20/857* (2025.01)
*H10H 20/85* (2025.01)

(52) U.S. Cl.
CPC ...... *H10H 20/857* (2025.01); *H10H 20/8506* (2025.01)

(58) Field of Classification Search
CPC ............... H10H 20/85; H10H 20/8502; H10H 20/8504; H10H 20/8506; H10H 20/8508;
(Continued)

(56) References Cited

U.S. PATENT DOCUMENTS 8,344,601 B2 * 1/2013 Baek .................. H10H 20/8585 313/46
8,860,069 B2 * 10/2014 Yoo .................... H10H 20/0362 257/E33.057

(Continued)

FOREIGN PATENT DOCUMENTS

CN 106409805 A * 2/2017 .......... H10W 70/421
CN 206274510 U * 6/2017

(Continued)

*Primary Examiner* — David A Zarneke

(74) *Attorney, Agent, or Firm* — Slater Matsil, LLP

(57) ABSTRACT

In an embodiment a component includes a metallic first lead frame part, a metallic second lead frame part, an electrically insulating base body mechanically connecting the lead frame parts to one another and directly surrounding the lead frame parts and an optoelectronic semiconductor chip, wherein each of the lead frame parts has a component side and an opposite mounting side, wherein the semiconductor chip is attached to the component side of the first lead frame part, wherein the first lead frame part includes a plurality of tongues extending towards an edge of the base body and end inside the base body, wherein the tongues extend spaced from a mounting plane, wherein, when viewed in plan view of the component side, the first lead frame part has an angular basic shape, wherein a first distance between the tongues and outer side surfaces of the base body is at least 50 μm, and wherein a second distance between the basic shape and the outer side surfaces is at least twice as large as the first distance.

12 Claims, 4 Drawing Sheets

(58) Field of Classification Search
CPC .. H10H 20/858; H10H 20/8582; H10H 29/85; H10H 29/8506; H10H 29/857; H10H 29/858; H10H 29/8582; H10W 70/421; H10W 70/433; H10W 70/461
See application file for complete search history.

(56) References Cited

U.S. PATENT DOCUMENTS

| | | | | |
|---|---|---|---|---|
| 9,793,442 | B2 * | 10/2017 | Gruendl | H10H 20/8506 |
| 10,153,403 | B2 * | 12/2018 | Naka | H10H 20/8506 |
| 10,431,528 | B2 * | 10/2019 | Iwai | H10W 70/421 |
| 12,278,318 | B2 * | 4/2025 | Schwarz | H10H 20/857 |
| 2013/0187188 | A1 | 7/2013 | Sasaoka et al. | |
| 2020/0227343 | A1 | 7/2020 | Huang | |
| 2022/0263001 | A1 | 8/2022 | Arndt et al. | |
| 2022/0376152 | A1 | 11/2022 | Schwarz | |
| 2023/0042041 | A1 | 2/2023 | Arndt et al. | |

FOREIGN PATENT DOCUMENTS

| | | | | |
|---|---|---|---|---|
| DE | 102013222703 | A1 | 5/2015 | |
| DE | 102019119371 | A1 * | 1/2021 | H10W 90/00 |
| DE | 102019211550 | A1 | 2/2021 | |
| WO | WO-9602943 | A1 * | 2/1996 | H10W 70/461 |
| WO | 2021144120 | A1 | 7/2021 | |

* cited by examiner

SURFACE-MOUNTABLE OPTOELECTRONIC SEMICONDUCTOR COMPONENT AND LEADFRAME ASSEMBLY

CROSS-REFERENCE TO RELATED APPLICATIONS

This patent application is a national phase filing under section 371 of PCT/EP2022/070794, filed Jul. 25, 2022, which claims the priority of German patent application 102021121365.7, filed Aug. 17, 2021 and German patent application 102021119451.2, filed Jul. 27, 2021, each of which is incorporated herein by reference in its entirety.

TECHNICAL FIELD

An optoelectronic semiconductor component is specified. A lead frame assembly is also specified.

SUMMARY

Embodiments provide an optoelectronic semiconductor component that can be mounted reliably.

According to at least one embodiment, the semiconductor component is surface mountable. This means that the semiconductor component can be attached to an external mounting carrier using surface mounting technology, or SMT for short. In particular, the semiconductor component comprises a flat mounting plane for this purpose.

According to at least one embodiment, the semiconductor component comprises a lead frame unit. The lead frame unit comprises at least one first lead frame part and at least one second lead frame part. In addition, at least one further lead frame part may be present. The lead frame unit and thus the lead frame parts are metallic. For example, the lead frame unit is made of a copper sheet. One or more coatings may be applied to the copper sheet, for example to improve solderability or to increase a reflectivity.

According to at least one embodiment, the lead frame parts each comprise a component side and an opposite mounting side. Preferably, all component sides lie in a common plane. Likewise, all mounting sides are preferably located in the mounting plane. A thickness of the lead frame parts is in particular equal to a distance between the common plane of the component sides and the mounting plane.

According to at least one embodiment, the lead frame parts are flat, unbent parts. This means that the lead frame parts can be free of bends, in particular in the direction perpendicular to the mounting plane. In other words, it is possible for the lead frame parts to extend only along the mounting plane and parallel to the mounting plane. Main directions of extension of the lead frame parts can be aligned parallel to the mounting plane. Alternatively, at least one of the lead frame parts can also be bent out of the mounting plane.

According to at least one embodiment, the semiconductor component comprises a base body. The base body is made of an electrically insulating material, such as a plastic. In particular, the base body is produced by injection molding and/or compression molding. The base body is located directly on the lead frame parts. The lead frame parts are mechanically connected to each other by the base body. In particular, a composite of the base body together with the lead frame parts is a component that mechanically carries and supports the semiconductor component.

According to at least one embodiment, the semiconductor component comprises one or more optoelectronic semiconductor chips. The at least one optoelectronic semiconductor chip is, for example, a light emitting diode chip or a laser diode chip. Alternatively or additionally, at least one photodiode chip may be present. If several of the optoelectronic semiconductor chips are present, these semiconductor chips may be identical in construction or different types of optoelectronic semiconductor chips may be combined, for example optoelectronic semiconductor chips for emitting white light with different color temperatures or optoelectronic semiconductor chips for generating red, green and blue light.

In addition to the at least one optoelectronic semiconductor chip, at least one further semiconductor chip may be present, for example to protect against damage caused by electrostatic discharge or to drive the at least one optoelectronic semiconductor chip.

According to at least one embodiment, the at least one optoelectronic semiconductor chip is attached to the component side of the first lead frame part. If several of the optoelectronic semiconductor chips are present, all of the optoelectronic semiconductor chips may be located on the same first lead frame part or several of the first lead frame parts are present, on each of which at least one of the optoelectronic semiconductor chips is located.

According to at least one embodiment, the first lead frame part has one or more tongues when viewed in plan view of the component side. The at least one tongue and the first lead frame part are formed as one piece. Thus, the at least one tongue and the entire first lead frame part are made of the same material, for example of the same copper sheet. Features that are disclosed here and in the following for at least one tongue can in particular be fulfilled for two or all tongues. Apart from their orientation, the tongues can in particular be formed similarly. This means, for example, that they have the same geometric dimensions and are made of the same material.

According to at least one embodiment, the at least one tongue extends towards an edge of the base body, viewed in plan view of the component side. This means, for example, that the at least one tongue extends away from a region on which the at least one optoelectronic semiconductor chip is located, in particular extends radially away.

According to at least one embodiment, the at least one tongue ends inside the base body, viewed in plan view of the component side. In other words, the at least one tongue does not extend to an outer side surfaces of the semiconductor component. It is possible that the at least one tongue is not visible to the naked eye when viewed from outside the semiconductor component.

According to at least one embodiment, the at least one tongue extends spaced from the mounting plane. This means that the mounting plane is preferably free of the at least one tongue. This can be achieved, for example, by half etching the lead frame parts.

In at least one embodiment, the optoelectronic semiconductor component, which is surface mountable, comprises

- a metallic first lead frame part,
- a metallic second lead frame part,
- an electrically insulating base body which mechanically connects the lead frame parts to one another and directly surrounds the lead frame parts, and
- an optoelectronic semiconductor chip, wherein
- the lead frame parts each comprise a component side and an opposite mounting side,
- the semiconductor chip is attached to the component side of the first lead frame part, viewed in plan view of the component side, the first lead frame part comprises at least one tongue which extends towards an edge of the base body and ends inside the base body, and the at least one tongue extends spaced from a mounting plane in which the mounting sides are located.

The semiconductor component described here is therefore in particular a QFN component with metal tongues.

During surface mounting of semiconductor components, fractures can occur in a plastic housing, i.e. in the base body. These fractures are usually discovered after soldering. However, one cause of the fractures does not appear to be the soldering itself, but rather a special mechanical stress that occurs during handling during mounting of the semiconductor components or during the transportation of circuit boards.

In the semiconductor component described here, the housing, i.e. the base body, is reinforced by concealed metal tongues in the lead frame. This makes the semiconductor component mechanically more stable.

This means that metal tongues are pulled into the plastic corners of the base body. As a result, the plastic does not break so easily when pressure is applied to the semiconductor component from above, for example during assembly of the semiconductor component. The metal-reinforced plastic can absorb greater forces and damage during the transportation of circuit boards or due to improper handling during assembly is avoided.

According to at least one embodiment, the first lead frame part has an angular basic shape when viewed in plan view of the component side. Alternatively, the first lead frame part has a round or semicircular basic shape when viewed in plan view of the component side, so that the first lead frame part is, for example, an ellipse or a semicircle when viewed in plan view. The at least one tongue extends away from a circumferential line of this basic shape in a direction towards the edge of the base body.

According to at least one embodiment, the at least one tongue extends from a corner of the basic shape facing away from the second lead frame part. Alternatively or additionally, the at least one tongue extends from a side edge of the basic shape facing away from the second lead frame part, again as seen in plan view of the component side.

According to at least one embodiment, the optoelectronic semiconductor component comprises several of the tongues. For example, one of the tongues extends from each corner of the basic shape facing away from the second lead frame part. Alternatively or additionally, one of the tongues extends from some or from each side edge of the basic shape, wherein the relevant side edge does not face the second lead frame part. This applies in particular when viewed in plan view of the relevant side of the component.

According to at least one embodiment, the tongues are symmetrical to a component longitudinal axis when viewed in plan view of component side. In other words, the component longitudinal axis forms a mirror axis for the tongues.

According to at least one embodiment, the lead frame parts are shaped overall asymmetrically with respect to the component longitudinal axis. In other words, the component longitudinal axis does not form a mirror axis for the first and/or second lead frame parts. It is possible that the first lead frame part and/or the second lead frame part do not have a mirror axis of symmetry, as viewed in plan view of the component side.

According to at least one embodiment, the basic shape is a rectangle or a square. Alternatively, the basic shape can also be a hexagon, such as a regular hexagon, or another regular or irregular polygon.

According to at least one embodiment, a first distance between the at least one tongue and the outer side surfaces of the base body (3) is at least 50 μm or at least 75 μm or at least 100 μm. Alternatively or additionally, this first distance is at most 250 μm or at most 150 μm or at most 125 μm.

According to at least one embodiment, a second distance between the basic shape and the outer side surfaces is at least twice as large or at least three times as large as the first distance. Alternatively or additionally, the second distance is at most eight times or at most five times the first distance.

The first and second distances are determined in particular when viewed in plan view of the component side.

According to at least one embodiment, a longitudinal axis of the at least one tongue extends towards an associated corner of the base body when viewed from above on the component side. In particular, the longitudinal axis intersects the associated corner of the base body, for example with a tolerance of at most 10 μm. The longitudinal axis can be an axis of symmetry of the tongue, viewed in plan view of the component side.

According to at least one embodiment, the longitudinal axis is a bisector with respect to this corner of the base body. This means that the longitudinal axis of the tongue in question divides the associated corner into two equal angles. This applies in particular with a tolerance of at most 10° or at most 5° or at most 2°.

According to at least one embodiment, the first lead frame part is thinner in the region of the at least one tongue than under the semiconductor chip. For example, a thickness of the tongue is at least 20% or at least 30% and/or at most 70% or at most 60% of a total thickness of the first lead frame part, wherein the total thickness may be present under the semiconductor chip. The total thickness is, for example, at least 40 μm or at least 100 μm and/or at most 0.5 mm or at most 0.2 mm.

According to at least one embodiment, the at least one tongue comprises a length of at least 3% or at least 5% or at least 7% of a diagonal length of the base body when viewed in plan view of the component side. Alternatively or additionally, this length is at most 25% or at most 20% or at most 15% of the diagonal length of the base body.

According to at least one embodiment, a width of the at least one tongue is at least 1% or at least 2% or at least 3% of the diagonal length of the base body when viewed in plan view of the component side. Alternatively or additionally, this width is at most 20% or at most 15% or at most 10% of the diagonal length of the base body.

According to at least one embodiment, the semiconductor chip is mounted in a trough of the base body. The trough is delimited by a circumferential wall. The wall can run all the way around the trough, whereby the wall can have a constant height. In particular, due to the trough, the first and second lead frame parts are exposed in places from a side of the semiconductor component opposite the mounting plane, so that the at least one optoelectronic semiconductor chip can be mounted on the lead frame parts. The trough can optionally be partially or completely filled with a filling. Such a filling includes, for example, at least one phosphor for converting a wavelength of radiation generated by the at least one optoelectronic semiconductor chip during operation.

According to at least one embodiment, the tongue or all tongues taken together make up at most 10% or at most 5% or at most 3% of a base area of the circumferential wall when viewed in plan view of the component side. Alternatively or additionally, this value is at least 1% or at least 2%. Thus, a material thickness of the base body extending from the mounting plane to a side of the base body opposite the mounting plane is not reduced too much by the at least one tongue. In other words, the at least one tongue does not increase, or does not greatly increase, a risk of removal of parts of the base body at the mounting plane from other parts of the base body.

According to at least one embodiment, the lead frame parts each comprise a plurality of connecting bars, also known as tie bars. The connecting bars extend as far as the outer side surfaces of the base body when viewed from in plan view of the component side. In particular, the connecting bars are visible to the naked eye when viewed from the outside of the side surfaces. Such connecting bars can be used to mechanically connect adjacent lead frame units in the lead frame assembly.

According to at least one embodiment, at least some of the lead frame parts, in particular the associated connecting bars, are each provided with a solder control bay. The solder control bays extend from the mounting sides of the relevant lead frame parts. It is possible that all connecting bars of the first lead frame part, but only some or only one of the connecting bars of the second lead frame part is provided with a solder control bay.

According to at least one embodiment, the first lead frame part and/or the second lead frame part is T-shaped when viewed in plan view of the mounting plane. In the case of the first lead frame part, all three end points of the T in the mounting plane can extend to the side surfaces of the base body. In the second lead frame part, on the other hand, only one base point of the T can optionally extend to one of the side surfaces.

According to at least one embodiment, some or all of the tongues comprise the same shape. This does not exclude the possibility that the tongues in question are shaped mirror-symmetrically or point-symmetrically to one another. Alternatively, differently shaped tongues may also be present.

In addition, a lead frame assembly is disclosed for such optoelectronic semiconductor components as described in connection with one or more of the above embodiments. Features of the lead frame assembly are therefore also disclosed for the optoelectronic semiconductor components and vice versa.

In at least one embodiment, the lead frame assembly is provided for optoelectronic semiconductor components and comprises a plurality of metallic lead frame units each having a first lead frame part and a second lead frame part, wherein:

- the lead frame parts each have a component side and an opposite mounting side,
- the component sides of the first lead frame parts are each configured to be provided with at least one optoelectronic semiconductor chip,
- viewed in plan view of the component side, the first lead frame parts each comprise at least one tongue and the at least one tongue extends in a star shape away from the associated first lead frame part, and
- the tongues are each spaced apart from a mounting plane in which the mounting sides are located.

In the following, an optoelectronic semiconductor component described herein and a lead frame assembly described herein are explained in more detail with reference to the drawing by means of exemplary embodiment. Identical reference signs indicate identical elements in the individual figures. However, no references to scale are shown; rather, individual elements may be shown in exaggerated size for better understanding.

DETAILED DESCRIPTION OF ILLUSTRATIVE EMBODIMENTS

Figure 1:
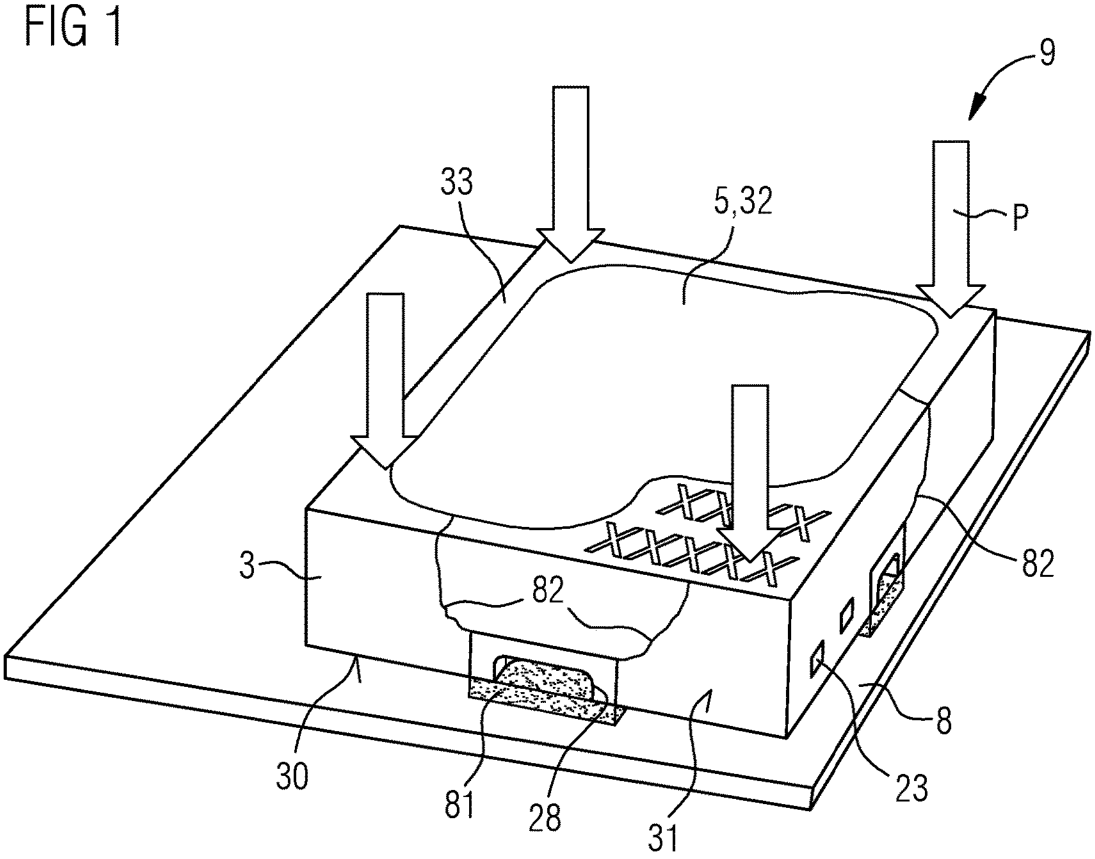
FIG. 1 shows a schematic perspective view of a modified semiconductor component.
Figure 2:
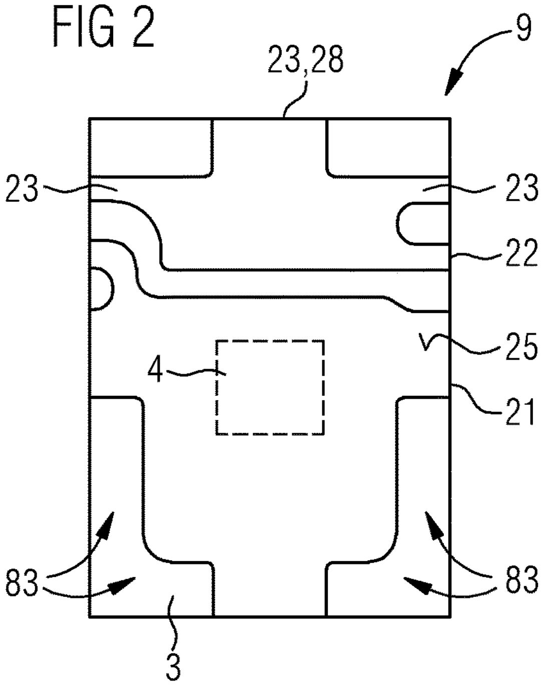
FIG. 2 shows a schematic plan view of component sides of lead frame parts of the semiconductor component of FIG. 1.
Figure 3:
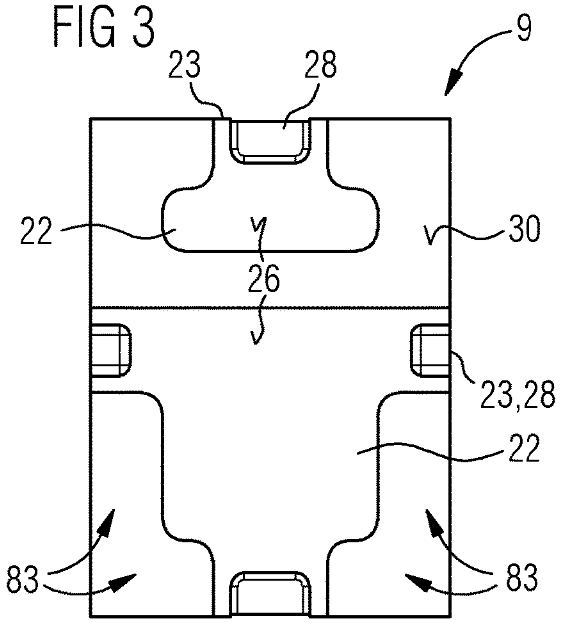
FIG. 3 shows a schematic plan view of the mounting sides of the lead frame parts of the semiconductor component of FIG. 1.

FIGS. 1 to 3 show a modification of a semiconductor component 9. The semiconductor component 9 comprises a base body 3, for example made of a plastic. A first lead frame part 21 and a second lead frame part 22 are embedded in the base body 3. An optoelectronic semiconductor chip 4, such as a light-emitting diode chip, or LED chip for short, is located on one component side 25 of the larger, first lead frame part 21.

The optoelectronic semiconductor chip 4 is arranged in a trough 32, the trough 32 being surrounded by a wall 33 of the base body 3. The wall 33 and the trough 32 are not shown in FIG. 2 to simplify the illustration. The trough 32 can be provided with a filling 5 which covers the optoelectronic semiconductor chip 4.

As can be seen in FIG. 1, the semiconductor component 9 is attached to an external mounting carrier 8, in particular by means of a solder 81. The solder 81 is thus located between the mounting carrier 8 and a mounting plane 30 of the semiconductor component 9, but only at the lead frame parts 21, 22. The solder 81 has a thickness between 50 μm and 100 μm between the lead frame parts 21, 22 and the mounting carrier 8, for example. Thus, regions of the mounting plane 30 formed by the base body 3 rather than the lead frame parts 21, 22 are spaced from the mounting carrier 8.

If a pressure p is now exerted on a side of the semiconductor component 9 facing away from the mounting carrier 8, cracks 82 can occur in the base body 3 on outer side surfaces 31, as the base body 3 is not supported on the mounting carrier 8 at corner regions 83 of the semiconductor component 9.

FIGS. 4 to 8 describe an exemplary embodiment of an optoelectronic semiconductor component 1. The semiconductor component 1 also comprises a first lead frame part 21 and a second lead frame part 22, wherein the first lead frame part 21 is optionally larger than the second lead frame part 22. One or more optoelectronic semiconductor chips 4 are arranged on the first lead frame part 21, wherein only one such semiconductor chip 4 is drawn in order to simplify the representation.

The optoelectronic semiconductor chip 4 is, for example, soldered or electrically conductively glued to the first lead frame part 21. The semiconductor chip 4 is electrically contacted, for example, via a bonding wire 41 that extends to the second lead frame part 22. Electrical contact regions of the semiconductor chip 4 are therefore located on opposite main sides of the semiconductor chip 4. Alternatively, the semiconductor chip 4 can also be a flip chip. In this case, electrical contact is made either via electrical connecting means, such as bonding wires, to both lead frame parts 21, 22, or the semiconductor chip 4 is attached, in particular soldered, to both lead frame parts 21, 22.

The at least one semiconductor chip 4 is located in a central region of the first lead frame part 21. The central region, which can be located centrally or approximately centrally in the base body 3 when viewed in plan view, has a rectangular basic shape 27. The rectangle forming the basic shape 27 can have rounded corners. The second lead frame part 22 can also have a rectangular basic shape.

Two tongues 24 extend away from the basic shape 27 of the first lead frame part 27 towards corners of the base body 3. The tongues 24 start at corners of the basic shape 27 of the first lead frame part 21 facing away from the second lead frame part 22. In other words, the tongues 24 represent protrusions from the basic shape 27. The tongues 24 can thus be regarded as projections beyond the basic shape 27.

Figure 4:
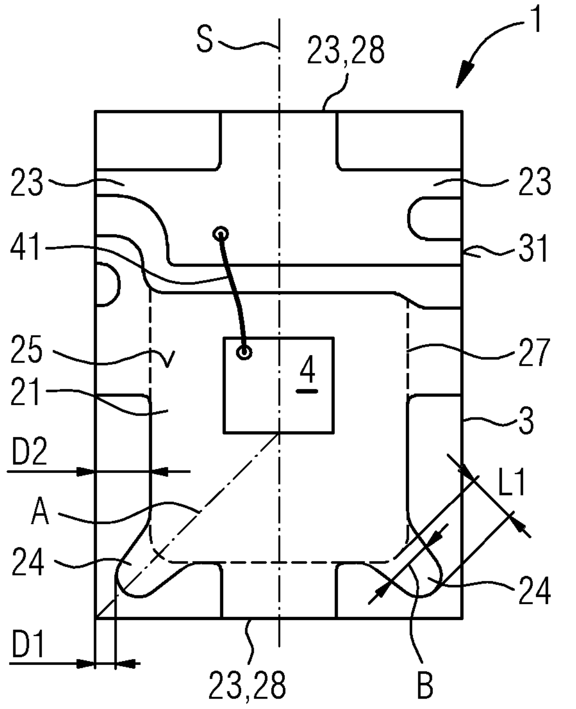
FIG. 4 shows a schematic plan view of a mounting plane of an exemplary embodiment of an optoelectronic semiconductor component described herein.
Figure 5:
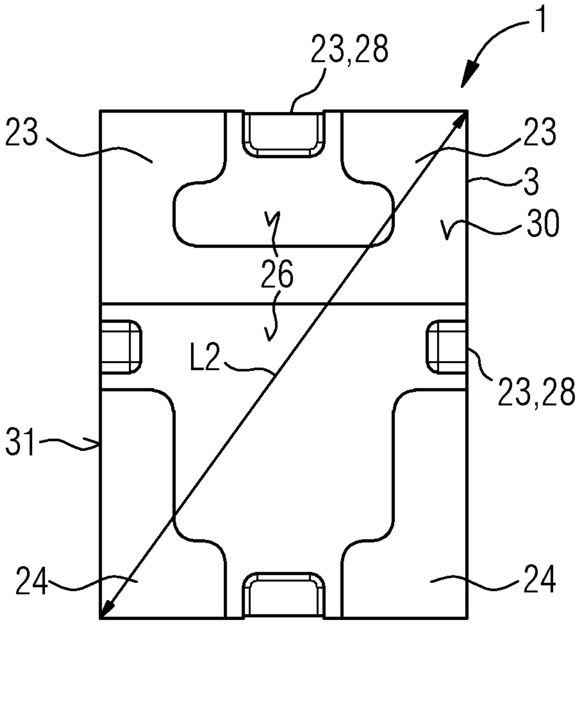
FIG. 5 shows a schematic plan view of a mounting side from below of the component of an exemplary embodiment of an optoelectronic semiconductor component described here.
Figure 6:
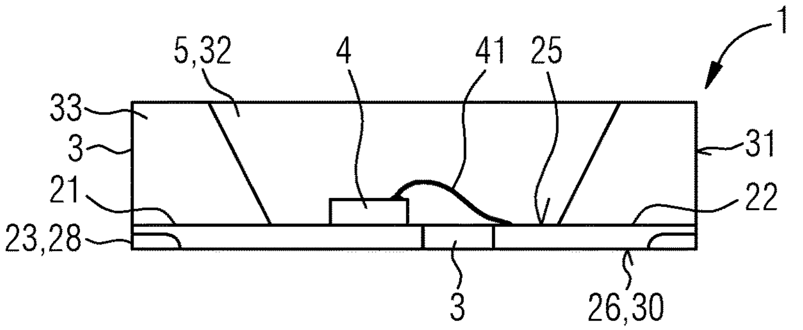
FIG. 6 shows a schematic sectional view of the optoelectronic semiconductor component of FIGS. 4 and 5.
Figure 7:
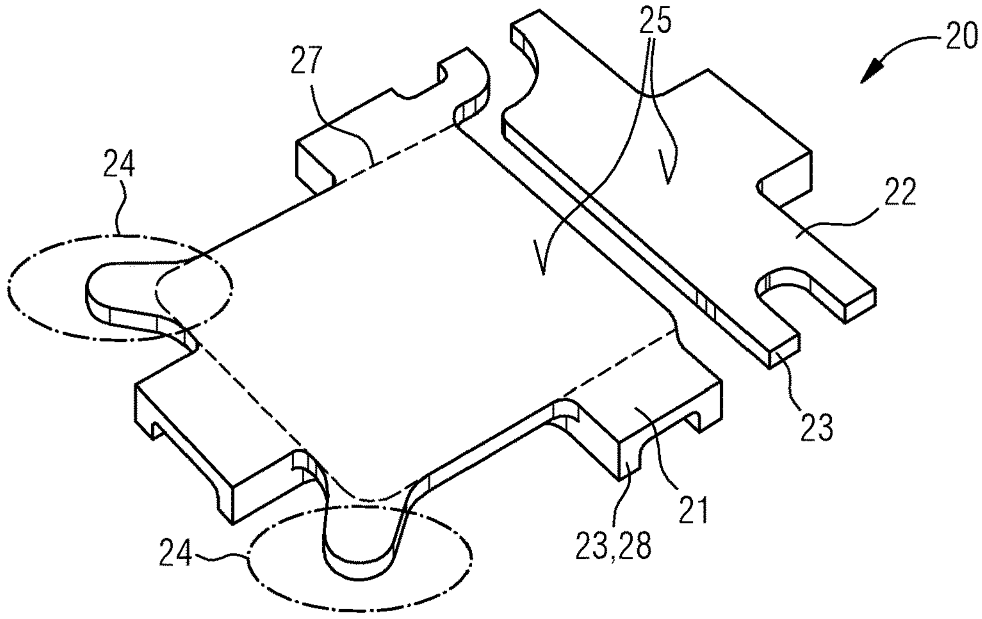
FIGS. 7 and 8 show schematic perspective views of the lead frame parts of the optoelectronic semiconductor component of FIGS. 4 and 5.
Figure 8:
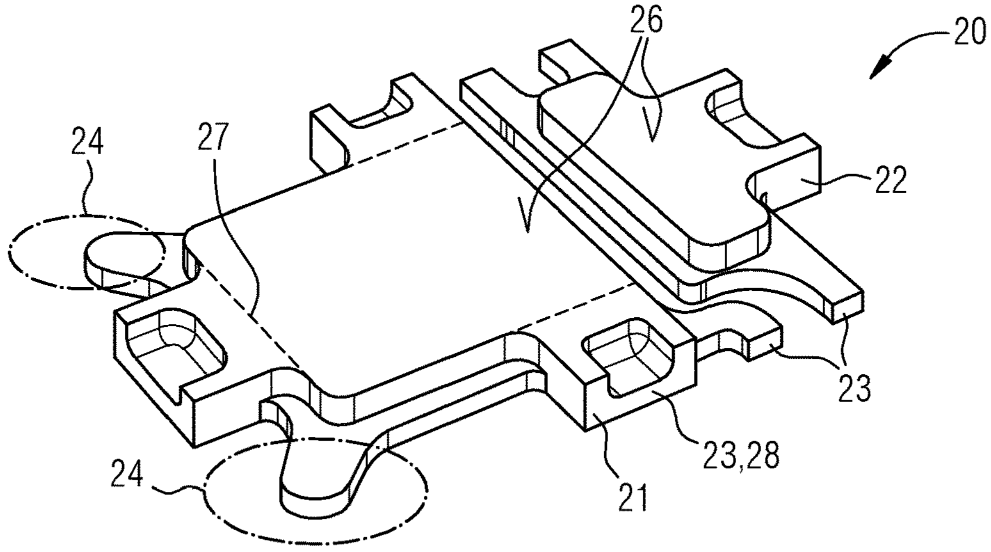

Thereby, the tongues 24, viewed in plan view of the component side 25, end inside the base body 3, see in particular FIG. 4, so that the tongues 24 do not extend as far as the outer side surfaces 31 of the base body 3. For example, a distance D1 between the tongues 24 and the outer side surfaces 31 is at least 75 μm.

The tongues 24 run along the component side 25, which preferably is located in one plane. That is, the tongues 24 do not extend to the mounting plane 30, see for example FIGS. 5 and 8. Thus, the lead frame parts 21, 22 are semi-etched. It can also be seen in FIGS. 7 and 8 that the basic shape 27 can be formed by the same geometric figure, such as a rectangle or a square, both on the component side 25 and on an opposite mounting side 26, wherein this geometric figure can be of different sizes on the component side 25 and on the mounting side 26. For example, the basic shape 27 is larger on the component side 25 than on the mounting side 26 of the first lead frame part 21 and optionally also of the second lead frame part 22.

Thus, the lead frame parts 21, 22 have their maximum material thickness in their central regions, in particular below the at least one semiconductor chip 4, whereas the first lead frame part 21 is thinner in a region of the tongues 24.

A width B of the tongues 24 is, for example, at least 5% and at most 15% of a diagonal length L2 of the base body 3. Alternatively or additionally, a length L1 of the tongues 24 beyond the basic shape 27 is at least 5% and at most 20% of the diagonal length L2. The diagonal length L2 is, for example, at least 1.4 mm and/or at most 10 mm.

Optionally, the tongues 24 extend directly towards the corners of the base body 3, see FIG. 4. This means, for example, that a longitudinal axis A of the tongues 24 intersects the associated outer corners of the base body 3. The longitudinal axis A can be an angle bisector for the associated corner, so that the longitudinal axis A bisects an angle between the side surfaces 31 that define the corresponding corner of the base body 3.

As a further option, the tongues 24 can be arranged mirror-symmetrically with respect to a component longitudinal axis S. A point at which the longitudinal axes A of the tongues 24 intersect the component longitudinal axis S can be covered by the semiconductor chip 4 or is at most one diagonal length of the semiconductor chip 4 away from it.

In order to enable sufficient material thickness of the base body 3 laterally around the lead frame parts 21, 22 from the wall 33 to the mounting side 30, the tongues 24 are preferably relatively small. In other words, although the tongues 24 increase a bending strength of the base body 3, a mechanical integrity of the base body 3 around the lead frame parts 21, 22 from the mounting plane 30 towards the component sides 25 is not or not significantly impaired. A distance D2 between the basic shape 27 and the outer side surfaces 31 is therefore preferably significantly greater than the distance D1 between the tongues 24 and the side surfaces 31.

It is possible that the tongues 24 extend completely below the wall 33. This means that the tongues 24 are preferably not exposed by the trough 32, see for example FIGS. 4 and 6. The trough 32 is optionally filled with a filling 5, which covers the semiconductor chip 4 and the bonding wire 41. The semiconductor chip 4 and the bonding wire 41 are thus preferably located completely within the trough 32. The filling is, for example, made of a transparent matrix material and particles embedded therein, such as phosphor particles.

The tongues 24 thus mechanically reinforce the base body 3 in the corner regions that are not supported by the mounting sides 26. The two remaining corners of the base body 3, in which there are no tongues 24, are preferably mechanically reinforced by means of the connecting bars 23, which extend from the second lead frame part 22.

Optionally, the lead frame parts 21, 22 each comprise one or more connecting bars 23, also known as tie bars. The connecting bars 23 extend to the outer side surfaces 31, so that the outer side surfaces 31 are partially formed by the connecting bars 23. For example, four of the connecting bars 23 are located at the first lead frame part 21 and three of the connecting bars 23 are located at the second lead frame part 22.

As a further option, the lead frame parts 21, 22 or at least one of the lead frame parts 21, 22 are provided with at least one solder control bay 28. The solder control bays 28 start at the mounting plane 30 and preferably do not extend to the component side 25. For example, three of the solder control bays 28 are located at the larger first lead frame part 21 and only one of the solder control bays 28 is located at the smaller second lead frame part 22, see in particular FIGS. 7 and 8. Preferably, the solder control bays 28 do not extend from the side surfaces 31 to the basic shape 27 of the component side 25, as viewed in plan view, see for example FIG. 8.

Those connecting bars 23 which are not provided with one of the solder control bays 28 preferably do not extend to the mounting plane 30, but extend along the component side 25. That is, the base body 3 is located between the mounting plane 30 and these connecting bars 23 without solder control bays. For example, the first lead frame part 21 comprises one connecting bar 23 without a solder control bay and the second lead frame part 22 comprises three connecting bars 23 without solder control bays.

It is possible that the basic shapes 27 of the mounting side 26 are surrounded all around by a ledge along the component side 25. In other words, the basic shapes 27 of the component sides 25 then overlap the basic shapes 27 of the mounting sides 26 all around, optionally with the exception along a side of the first lead frame part 21 facing the second lead frame part 22.

Figure 9:
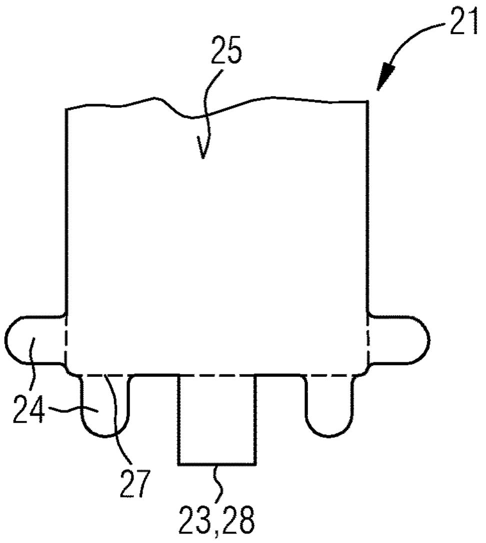
FIGS. 9 and 10 show schematic plan views of lead frame parts for exemplary embodiments of optoelectronic semiconductor components described herein.

In the exemplary embodiment of FIG. 9, the tongues 24 do not start at the corners of the first lead frame part 21, but at its sides. There can thus be more than two of the tongues 24, for example a total number of four of the tongues 24. Such an arrangement of the tongues 24 can also be present in all other exemplary embodiment.

In all other respects, the statements with respect to FIGS. 4 to 8 apply in the same way to FIG. 9, and vice versa.

Figure 10:
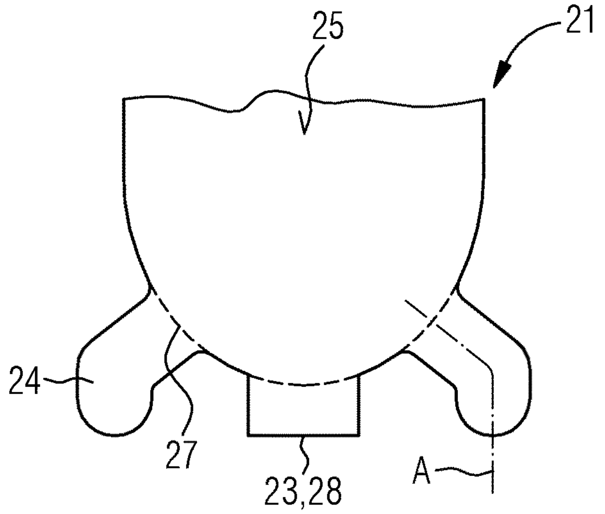

In the exemplary embodiment of FIG. 10, it is shown that the basic shape 27 need not be a rectangle or polygon, but can also be formed by a round geometric figure, such as an ellipse or semi-ellipse. The same applies to all other exemplary embodiment.

According to FIG. 10, the tongues 24 start, for example, from points on the circumferential line of the basic shape 27 that are closest to the assigned corners of the base body 3, not shown in FIG. 10.

Another option illustrated in FIG. 10 is that the tongues 24 do not have to be straight, but can also have a curved or kinked longitudinal axis A. Preferably, however, the longitudinal axis A runs along a straight line. The same applies to all other exemplary embodiments.

In all other respects, the statements with respect to FIGS. 4 to 9 apply in the same way to FIG. 10, and vice versa.

Figure 11:
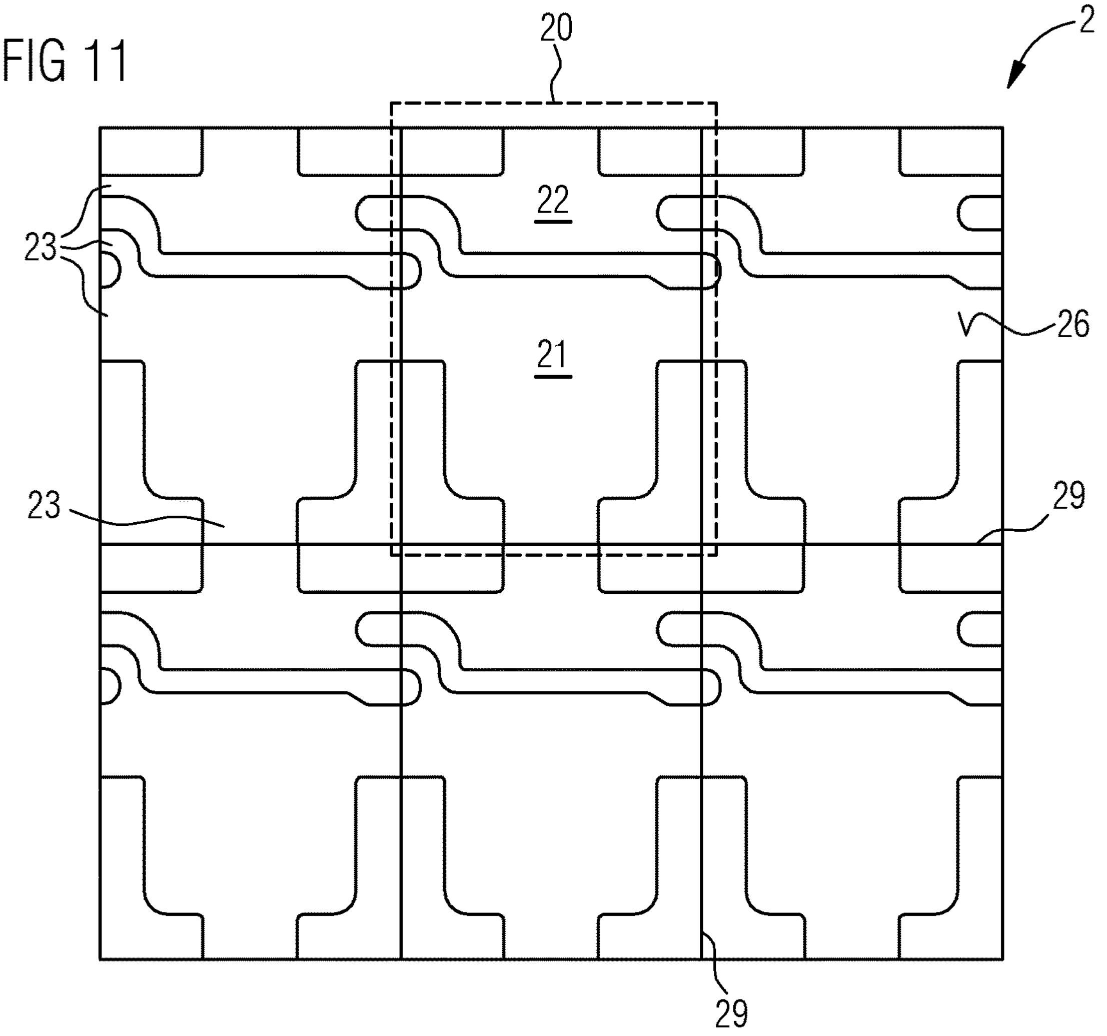
FIG. 11 is a schematic plan view of a lead frame assembly for optoelectronic semiconductor components described herein.

FIG. 11 shows an exemplary embodiment of a lead frame assembly 2 comprising a plurality of lead frame units 20. Each of the lead frame units 20 is provided for one of the optoelectronic semiconductor components 1. Preferably, all lead frame units 20 are identical in construction.

The lead frame units 20 are generated, for example, by punching, etching and/or cutting from a metal sheet, such as a copper sheet. The lead frame units 20 are mechanically connected to each other by means of the connecting bars 23. Separation lines 29 run between adjacent lead frame units 20, along which the lead frame units 20 are singulated to form the semiconductor components 1 after the base bodies 3 have been generated.

In all other respects, the statements with respect to FIGS. 4 to 10 apply in the same way to FIG. 11, and vice versa.

The components shown in the figures preferably follow one another in the order indicated, in particular directly one after the other, unless otherwise described. Components not touching each other in the figures are preferably spaced apart. If lines are drawn parallel to each other, the associated surfaces are preferably also aligned parallel to each other. In addition, the relative positions of the drawn components to each other are shown correctly in the figures, unless otherwise specified.

The invention described herein is not limited by the description based on the exemplary embodiments. Rather, the invention includes any new feature as well as any combination of features, which includes in particular any combination of features in the patent claims, even if this feature or combination itself is not explicitly stated in the patent claims or exemplary embodiments.

The invention claimed is:

1. A surface mountable optoelectronic semiconductor component comprising:

a metallic first lead frame part;

a metallic second lead frame part;

an electrically insulating base body mechanically connecting the lead frame parts to one another and directly surrounding the lead frame parts; and an optoelectronic semiconductor chip, wherein each of the lead frame parts comprises a component side and an opposite mounting side, wherein the semiconductor chip is attached to the component side of the first lead frame part, wherein the first lead frame part comprises a plurality of tongues in plan view of the component side, which extends towards an edge of the base body and end inside the base body, wherein the tongues extend spaced from a mounting plane in which the mounting sides are located, wherein, when viewed in the plan view of the component side, the first lead frame part comprises an angular basic shape and only from each corner of the basic shape facing away from the second lead frame part, one tongue extends, wherein a first distance between the tongues and outer side surfaces of the base body is at least 50 μm, and wherein a second distance between the basic shape and the outer side surfaces is at least twice as large as the first distance.

2. The optoelectronic semiconductor component according to claim 1, wherein, when viewed in the plan view of the component side, the tongues are designed symmetrically with respect to a component longitudinal axis, and wherein the lead frame parts are shaped overall asymmetrically with respect to the component longitudinal axis.

3. The optoelectronic semiconductor component according claim 1, wherein the basic shape is a rectangle.

4. The optoelectronic semiconductor component according to claim 1, wherein, when viewed in the plan view of the component side, a longitudinal axis of at least one of the tongues extends towards an associated corner of the base body, and wherein the longitudinal axis is an angle bisector with respect to the corner of the base body, with a tolerance of at most 10°.

5. The optoelectronic semiconductor component according claim 1, wherein the first lead frame part is thinner in a region of at least one of the tongues than under the semiconductor chip.

6. The optoelectronic semiconductor component according to claim 1, wherein, when viewed in the plan view of the component side, at least one of the tongues comprises a length of at least 5% and of at most 20% of a diagonal length of the base body.

7. The optoelectronic semiconductor component according to claim 1, wherein, when viewed in the plan view of the component side, a width of at least one of the tongues is at least 2% and at most 15% of a diagonal length of the base body.

8. The optoelectronic semiconductor component according to claim 1, wherein the semiconductor chip is mounted in a trough of the base body, wherein the trough is delimited by a circumferential wall, and wherein the tongues make up at most 5% of a base area of the circumferential wall when viewed in the plan view of the component side.

9. The optoelectronic semiconductor component according to claim 1, wherein each of the lead frame parts comprises a plurality of connecting bars, wherein the connecting bars extend as far as the outer side surfaces of the base body when viewed in the plan view of the component side.

10. The optoelectronic semiconductor component according to claim 9, wherein at least some of the connecting bars are each provided with a solder control bay, and wherein the solder control bays extend from the mounting sides of the lead frame parts.

11. The optoelectronic semiconductor component according to claim 1, wherein each of the lead frame parts is T-shaped when viewed in the plan view of the mounting plane.

12. A lead frame assembly for optoelectronic semiconductor components, the lead frame assembly comprising:

a plurality of metallic lead frame units each having a first lead frame part and a second lead frame part, wherein each of the lead frame parts has a component side and an opposite mounting side, wherein each component side of the first lead frame parts is configured to be provided with an optoelectronic semiconductor chip, wherein, when viewed in a plan view of the component side, each of the first lead frame parts has at least one tongue and each of the tongues extends in a star shape away from an associated first lead frame part, and wherein each of the tongues extends and is spaced from a mounting plane in which the mounting sides are located, wherein, when viewed in the plan view of the component side, each of the first lead frame parts has an angular basic shape and only from each corner of the basic shape facing away from the second lead frame part, one of the tongues extends in each case.

* * * * *